United States Patent
Yamazaki

(10) Patent No.: US 9,755,082 B2
(45) Date of Patent: Sep. 5, 2017

(54) SEMICONDUCTOR DEVICE INCLUDING OXIDE SEMICONDUCTOR WITH AN INSULATING FILM INCLUDING GALLIIUM AND OXYGEN

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1194 days.

(21) Appl. No.: 13/153,919

(22) Filed: Jun. 6, 2011

(65) Prior Publication Data

US 2011/0303914 A1    Dec. 15, 2011

(30) Foreign Application Priority Data

Jun. 11, 2010  (JP) ................................. 2010-134428
Apr. 12, 2011  (JP) ................................. 2011-088119

(51) Int. Cl.
*H01L 29/10*  (2006.01)
*H01L 29/12*  (2006.01)
*H01L 29/786*  (2006.01)

(52) U.S. Cl.
CPC .... *H01L 29/7869* (2013.01); *H01L 29/78603* (2013.01)

(58) Field of Classification Search
CPC ...................... H01L 29/7869; H01L 29/78603
USPC ............................. 257/43, E29.095, E29.101
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| | | |
|---|---|---|
| EP | 1 737 044 A1 | 12/2006 |
| EP | 2144294 A | 1/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

(Continued)

*Primary Examiner* — Stephen W Smoot
*Assistant Examiner* — Vicki B Booker
(74) *Attorney, Agent, or Firm* — Fish & Richardson P.C.

(57) ABSTRACT

One object is to provide a semiconductor device including an oxide semiconductor with improved electrical characteristics. The semiconductor device includes a first insulating film including an element of Group 13 and oxygen; an oxide semiconductor film partly in contact with the first insulating film; a source electrode and a drain electrode electrically connected to the oxide semiconductor film; a gate electrode overlapping with the oxide semiconductor film; and a second insulating film partly in contact with the oxide semiconductor film, between the oxide semiconductor film and the gate electrode. Further, the first insulating film including an element of Group 13 and oxygen includes a region where an amount of oxygen is greater than that in a stoichiometric composition ratio.

16 Claims, 13 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,205,640 B2 | 4/2007 | Yoshioka et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,906,780 B2 | 3/2011 | Iwasaki |
| 7,994,500 B2 | 8/2011 | Kim et al. |
| 8,058,645 B2 | 11/2011 | Jeong et al. |
| 8,093,589 B2 | 1/2012 | Sugihara et al. |
| 8,134,151 B2 | 3/2012 | Imai |
| 8,148,779 B2 | 4/2012 | Jeong et al. |
| 8,178,884 B2 | 5/2012 | Ha et al. |
| 8,188,480 B2 | 5/2012 | Itai |
| 8,193,535 B2 | 6/2012 | Ha et al. |
| 8,203,143 B2 | 6/2012 | Imai |
| 8,461,594 B2 | 6/2013 | Morosawa et al. |
| 8,728,862 B2 | 5/2014 | Ha et al. |
| 8,742,418 B2 | 6/2014 | Morosawa et al. |
| 9,257,594 B2 | 2/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Theiss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0006833 A1 | 1/2010 | Ha et al. |
| 2010/0025677 A1 | 2/2010 | Yamazaki et al. |
| 2010/0038641 A1 | 2/2010 | Imai |
| 2010/0051940 A1 | 3/2010 | Yamazaki et al. |
| 2010/0065838 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117086 A1 | 5/2010 | Akimoto et al. |
| 2010/0295041 A1 | 11/2010 | Kumomi et al. |
| 2011/0140100 A1 | 6/2011 | Takata et al. |
| 2011/0175090 A1 | 7/2011 | Sugihara et al. |
| 2011/0180903 A1* | 7/2011 | Hata ........................ 257/614 |
| 2011/0193083 A1 | 8/2011 | Kim et al. |
| 2012/0119205 A1 | 5/2012 | Taniguchi et al. |
| 2012/0132908 A1 | 5/2012 | Sugihara et al. |
| 2013/0092932 A1 | 4/2013 | Yamazaki et al. |

FOREIGN PATENT DOCUMENTS

| | | |
|---|---|---|
| EP | 2157615 A | 2/2010 |
| EP | 2 226 847 | 9/2010 |
| JP | 63-210024 A | 8/1968 |
| JP | 63-215519 A | 9/1968 |
| JP | 60-198661 A | 10/1985 |
| JP | 63-210022 A | 8/1988 |
| JP | 63-210023 A | 8/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2006-165528 A | 6/2006 |
| JP | 2007-201366 A | 8/2007 |
| JP | 2008-098447 A | 4/2008 |
| JP | 2008-294402 A | 12/2008 |

(56) References Cited

FOREIGN PATENT DOCUMENTS

| | | |
|---|---|---|
| JP | 2009-231613 A | 10/2009 |
| JP | 2010-016347 A | 1/2010 |
| JP | 2010-021520 A | 1/2010 |
| JP | 2010-067954 A | 3/2010 |
| JP | 2010056541 A | 3/2010 |
| JP | 2010-074138 A | 4/2010 |
| JP | 2010080947 A | 4/2010 |
| JP | 2010093238 A | 4/2010 |
| JP | 2010-114413 A | 5/2010 |
| JP | 2011-243745 A | 12/2011 |
| JP | 2012-059860 A | 3/2012 |
| JP | 2012-160679 A | 8/2012 |
| KR | 20100014167 A | 2/2010 |
| TW | 201027752 | 7/2010 |
| WO | WO-03/098699 | 11/2003 |
| WO | 2004/114391 A1 | 12/2004 |
| WO | WO-2007/086291 | 8/2007 |
| WO | 2010029859 A1 | 3/2010 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studes of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature" Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependense of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotii, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper. 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel, YbFe2O4, and Yb2Fe3O7 Types of Structures for Compounds in the In2O3 and Sc2O3—A2O3—BO Systems [A; Fe, Ga, or Al: B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa. Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee. M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

(56) References Cited

OTHER PUBLICATIONS

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp, 1624-1630.

Meiboom, S et al., "Theory of the Blue Phase of Cholesteric Liquid Crystals," Phys. Rev. E . (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system of 1350° C." Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors." Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432 pp. 488-492.

Nomura, K et al., "Cartier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of Zno Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m(m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor" IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report (Application No. PCT/JP2011/061589) dated Aug. 16, 2011, in English.

Written Opinion (Application No. PCT/JP2011/061589) dated Aug. 16, 2011, in English.

Masaya Nakayama et al.; "17a-TL-8 Effect of GaO Layer on IGZO-TFT Channel"; Extended Abstracts (The 57th Spring Meeting 2010); The Japan Society of Applied Physics and Related Societies; Mar. 17, 2010; p. 21-008 with English translation.

Taiwanese Office Action (Application No. 100119380) Dated Jan. 19, 2016.

* cited by examiner

FIG. 11B1            FIG. 11B2

SEMICONDUCTOR DEVICE INCLUDING OXIDE SEMICONDUCTOR WITH AN INSULATING FILM INCLUDING GALLIIUM AND OXYGEN

TECHNICAL FIELD

The present invention relates to a semiconductor device and a manufacturing method thereof.

In this specification, a semiconductor device generally means a device which can function by utilizing semiconductor characteristics, and an electrooptic device, a semiconductor circuit, and electronic appliance are all semiconductor devices.

BACKGROUND ART

A technique by which transistors are formed using semiconductor thin films formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor in which an amorphous oxide containing indium (In), gallium (Ga), and zinc (Zn) and having an electron carrier concentration of lower than $10^{18}/cm^3$ is used for a semiconductor layer which is used for a channel formation region of the transistor is disclosed (see Patent Document 1).

REFERENCE

[Patent Document 1] Japanese Published Patent Application No. 2006-165528

DISCLOSURE OF INVENTION

However, the electric conductivity of an oxide semiconductor might change when deviation from the stoichiometric composition ratio due to deficiency of oxygen or the like occurs, or hydrogen or water forming an electron donor enters the oxide semiconductor, during a manufacturing process of a device. Such a phenomenon becomes a factor of variation in the electric characteristics of a semiconductor device, such as a transistor, including the oxide semiconductor.

In view of the above problem, an object of one embodiment of the present invention is to provide a semiconductor device including an oxide semiconductor with improved electric characteristics.

In one embodiment of the present invention, an insulating film including a constituent element (for example, an element of Group 13 or oxygen) of an oxide semiconductor film is provided in contact with the oxide semiconductor film, whereby the state of the interface between the oxide semiconductor film and the insulating film is kept favorable. More specifically, the following structures can be employed, for example.

One embodiment of the present invention is a semiconductor device including a first insulating film including an element of Group 13 and oxygen; an oxide semiconductor film partly in contact with the first insulating film; a source electrode and a drain electrode electrically connected to the oxide semiconductor film; a gate electrode overlapping with the oxide semiconductor film; and a second insulating film partly in contact with the oxide semiconductor film, between the oxide semiconductor film and the gate electrode.

In the above structure, the first insulating film including an element of Group 13 and oxygen preferably includes a region where an amount of oxygen is greater than that in the stoichiometric composition ratio. Further, in the above structure, it is preferable that the first insulating film including an element of Group 13 and oxygen include one or more of gallium oxide, aluminum oxide, aluminum gallium oxide, and gallium aluminum oxide.

The first insulating film including an element of Group 13 and oxygen includes aluminum, gallium, and oxide. An apparent compositional formula of the first insulating film is represented by $Al_xGa_{2-x}O_{3+\alpha}$ ($1<x<2$, $1\geq\alpha>0$) or $Al_xGa_{2-x}O_{3+\alpha}$ ($0<x\leq1$, $1>\alpha>0$).

Another embodiment of the present invention is a semiconductor device including a first insulating film; an oxide semiconductor film partly in contact with the first insulating film; a source electrode and a drain electrode electrically connected to the oxide semiconductor film; a gate electrode overlapping with the oxide semiconductor film; and a second insulating film including an element of Group 13 and oxygen partly in contact with the oxide semiconductor film, between the oxide semiconductor film and the gate electrode.

In the above structure, the second insulating film including an element of Group 13 and oxygen preferably includes a region where an amount of oxygen is greater than that in the stoichiometric composition ratio. Further, in the above structure, the second insulating film including an element of Group 13 and oxygen preferably includes one or more of gallium oxide, aluminum oxide, aluminum gallium oxide, and gallium aluminum oxide.

The second insulating film including an element of Group 13 and oxygen includes aluminum, gallium, and oxide. An apparent compositional formula of the second insulating film is represented by $Al_xGa_{2-x}O_{3+\alpha}$ ($1<x<2$, $1\geq\alpha>0$) or $Al_xGa_{2-x}O_{3+\alpha}$ ($0<x\leq1$, $1>\alpha>0$).

Another embodiment of the present invention is a semiconductor device including a first insulating film including an element of Group 13 and oxygen; an oxide semiconductor film partly in contact with the first insulating film; a source electrode and a drain electrode electrically connected to the oxide semiconductor film; a gate electrode overlapping with the oxide semiconductor film; and a second insulating film including an element of Group 13 and oxygen partly in contact with the oxide semiconductor film, between the oxide semiconductor film and the gate electrode.

In the above structure, the first insulating film including an element of Group 13 and oxygen and the second insulating film including an element of Group 13 and oxygen preferably each include a region where an amount of oxygen is greater than that in the stoichiometric composition ratio. Further, the first insulating film including an element of Group 13 and oxygen and the second insulating film including an element of Group 13 and oxygen preferably each include one or more of gallium oxide, aluminum oxide, aluminum gallium oxide, and gallium aluminum oxide.

In the above structure, the second insulating film including an element of Group 13 and oxygen is preferably in contact with the source electrode and the drain electrode and is preferably provided in contact with the first insulating film including an element of Group 13 and oxygen. In the above structure, the oxide semiconductor film is preferably surrounded by the first insulating film including an element of Group 13 and oxygen and the second insulating film including an element of Group 13 and oxygen.

In the above structure, the oxide semiconductor film preferably includes at least one of In, Ga, and Zn.

In the above, oxygen doping treatment is preferably performed on the first insulating film including an element of Group 13 and oxygen and the second insulating film including an element of Group 13 and oxygen. By performing oxygen doping treatment, a region where an amount of oxygen is greater than that in the stoichiometric composition ratio can be formed in the first insulating film including an element of Group 13 and oxygen and the second insulating film including an element of Group 13 and oxygen.

Note that the above-described "oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

Note that the above oxygen doping treatment may be performed on the oxide semiconductor film.

Further, the oxide semiconductor film is preferably an i-type oxide semiconductor film. Here, an i-type (intrinsic) oxide semiconductor refers to an oxide semiconductor which is highly purified by removing hydrogen, which is an n-type impurity to an oxide semiconductor, from the oxide semiconductor so that impurities that are not main components of the oxide semiconductor are contained as little as possible, and further, in which oxygen defects (also referred to as oxygen vacancies) are reduced by supplying oxygen. In an i-type oxide semiconductor film, the number of hydrogen atoms serving as electron donors are sufficiently reduced and, in addition, defects due to oxygen deficiency are sufficiently reduced; therefore, degradation of the interface characteristics due to hydrogen existing in the oxide semiconductor film and oxygen defects can be suppressed.

Note that purification of an oxide semiconductor also has an effect of preventing variation in electric characteristics of a transistor. Therefore, purification of an oxide semiconductor is extremely effective for improvement in transistor characteristics.

According to one embodiment of the present invention, the state of the interface between the oxide semiconductor film and the insulating film can be kept favorable. Therefore, a semiconductor device with improved electrical characteristics can be provided.

BRIEF DESCRIPTION OF DRAWINGS

FIGS. 11A, 11B1, and 11B2 illustrate discharge states in an AC sputtering method.

BEST MODE FOR CARRYING OUT THE INVENTION

Hereinafter, embodiments of the present invention will be described in detail with reference to the accompanying drawings. However, the present invention is not limited to the description below; and it is easily understood by those skilled in the art that modes and details disclosed herein can be modified in various ways without departing from the spirit and the scope of the present invention. Therefore, the present invention is not construed as being limited to description of the embodiments.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, one embodiment of a semiconductor device and a method for manufacturing the semiconductor device will be described with reference to FIGS. 1A to 1C, FIGS. 2A to 2D, FIGS. 3A to 3E, FIGS. 4A to 4D, and FIGS. 5A to 5D.

<Example of Structure of Semiconductor Device>

Figure 1A:
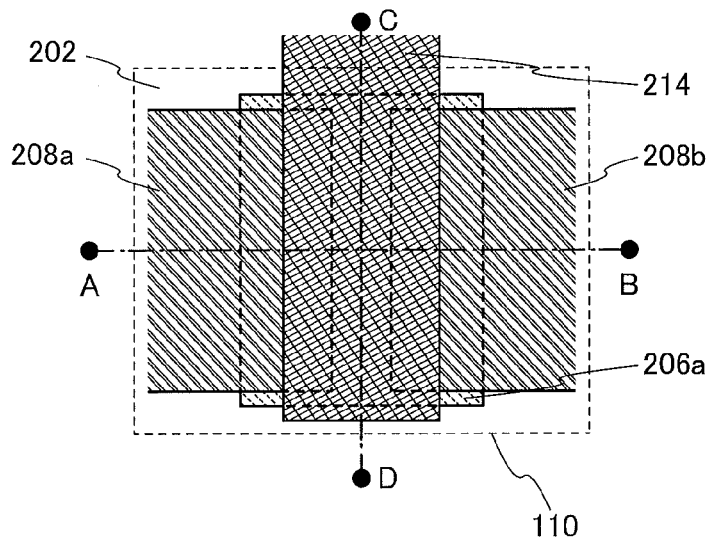
FIGS. 1A to 1C are a plan view and cross-sectional views illustrating one embodiment of a semiconductor device.
Figure 1B:
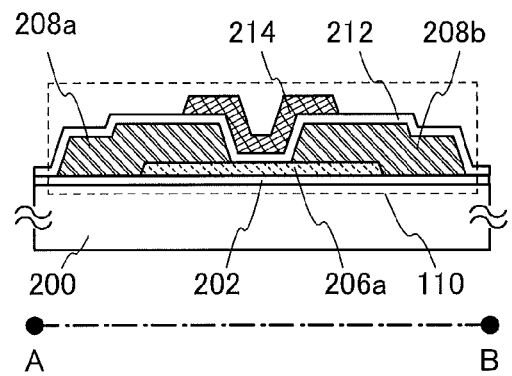
Figure 1C:
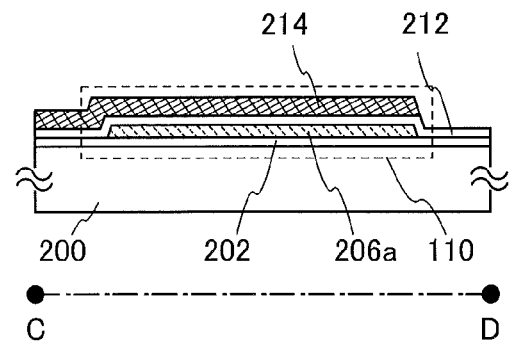

FIGS. 1A to 1C are a plan view and cross-sectional views, of a transistor 110 as an example of a semiconductor device according to one embodiment of the disclosed invention. Here, FIG. 1A is a plan view, and FIG. 1B and FIG. 1C are cross-sectional views taken along lines A-B and C-D of FIG. 1A, respectively. Note that some of components of the transistor 110 (e.g., an insulating film 212) are omitted in FIG. 1A for brevity.

The transistor 110 in FIGS. 1A to 1C includes, over a substrate 200, an insulating film 202, an oxide semiconductor film 206a, a source electrode 208a, a drain electrode 208b, the insulating film 212, and a gate electrode 214. In the transistor 110 illustrated in FIGS. 1A to 1C, the oxide semiconductor film 206a is provided in contact with the insulating film 202 and the insulating film 212.

Here, the oxide semiconductor film 206a is preferably an oxide semiconductor film which is highly purified by sufficiently removing an impurity such as hydrogen or water therefrom or sufficiently supplying oxygen thereto. Specifically, for example, the hydrogen concentration in the oxide semiconductor film 206a is $5\times10^{19}$ atoms/cm$^3$ or less, preferably $5\times10^{18}$ atoms/cm$^3$ or less, more preferably $5\times10^{17}$ atoms/cm$^3$ or less. Note that the hydrogen concentration in the oxide semiconductor film 206a is measured by secondary ion mass spectroscopy (SIMS). In the oxide semiconductor film 206a which is highly purified by sufficiently reducing the hydrogen concentration and in which defect levels in an energy gap due to oxygen deficiency are reduced by supplying a sufficient amount of oxygen, the carrier concentration is less than $1\times10^{12}$/cm$^3$, preferably less than $1\times10^{11}$/cm$^3$, more preferably less than $1.45\times10^{10}$/cm$^3$. For example, the off-state current (here, current per micrometer (μm) of channel width) at room temperature (25° C.) is lower than or equal to 100 zA (1 zA (zeptoampere) is $1\times10^{-21}$ A), preferably lower than or equal to 10 zA. In this manner, by using an i-type oxide semiconductor, a transistor having excellent electric characteristics can be obtained.

The insulating film 202 serves as a base film of the transistor 110. For example, the insulating film 202 is formed using a silicon material such as silicon oxide, silicon nitride, silicon oxynitride, or silicon nitride oxide. Alternatively, the insulating film 202 can be formed using a material including an element of Group 13 and oxygen. For example, as the material including an element of Group 13 and oxygen, a material including one or more of gallium oxide, aluminum oxide, aluminum gallium oxide, and gallium aluminum oxide is given. Here, aluminum gallium oxide refers to a substance that contains aluminum more than gallium in atomic %, and gallium aluminum oxide refers to a substance that contains gallium more than aluminum in atomic %. Note that the insulating film 202 can be formed to have a single-layer structure or a stacked-layer structure using the above materials.

For example, in the case where the insulating film 202 is formed as a single layer, a material including an element of Group 13 and oxygen is preferably used. In the case where the insulating film 202 is formed as a stacked layer, a film using a material including an element of Group 13 and oxygen is preferably formed over a film using a silicon material. Accordingly, the film including an element of Group 13 and oxygen (the insulating film) can be provided in contact with the oxide semiconductor film 206a.

Many oxide semiconductor materials that can be used for forming the oxide semiconductor film 206a include an element of Group 13. Therefore, in the case where the film including an element of Group 13 and oxygen (the insulating film 202) is provided in contact with the oxide semiconductor film 206a, the state of the interface with the oxide semiconductor film can be kept favorable. This is because a material including an element of Group 13 and oxygen is well matched with an oxide semiconductor material.

For example, in the case where an oxide semiconductor film including gallium is formed, by using a material including gallium oxide for the insulating film 202, characteristics of an interface between the oxide semiconductor film and the insulating film 202 can be kept favorable. By providing the oxide semiconductor film in contact with the insulating film including gallium oxide, a pileup of hydrogen at an interface between the oxide semiconductor film and the insulating film can be reduced, for example. Note that, in the case where an element belonging to the same group as a constituent element of the oxide semiconductor is used, a similar effect can be obtained. That is, for the insulating film 202, it is also effective to use a material including aluminum oxide or the like. Aluminum oxide does not easily transmit water; therefore, it is preferable to use the material including aluminum oxide in preventing water from entering the oxide semiconductor film.

Furthermore, since an oxide semiconductor film has a strong ionic bonding property and a silicon-based oxide film has a strong covalent bonding property, when these films are in contact with each other, it is considered that a pileup of hydrogen easily occurs in the silicon-based oxide film having a high covalent bond property. In contrast, a film including an element of Group 13 and oxygen, as well as the oxide semiconductor film, has an ionic bonding property; therefore, when these films are in contact with each other, it is considered that a pileup of hydrogen does not easily occur in the film including an element of Group 13 and oxygen.

Note that two or more kinds of elements of Group 13 may be included in the insulating film 202. For example, the above described material such as aluminum gallium oxide including gallium and aluminum (or gallium aluminum oxide), as described above, may be used for the insulating film 202. In this case, both the effect resulting from including gallium and the effect resulting from including aluminum can be obtained, which is preferable. By providing the oxide semiconductor film in contact with aluminum gallium oxide, water is prevented from entering the oxide semiconductor film and a pileup at an interface between the oxide semiconductor film and the insulating film can be sufficiently reduced, for example.

Moreover, the insulating film 202 preferably includes a region where an amount of oxygen is greater than that in the stoichiometric composition ratio. Accordingly, oxygen is supplied to the oxide semiconductor film, and oxygen defects in the oxide semiconductor film or at an interface between the oxide semiconductor film and the insulating film 202 can be reduced.

Note that in the case where an oxide semiconductor without oxygen defects is used, the amount of oxygen included in the insulating film 202 may be equal to that in the stoichiometric composition ratio. However, in order to ensure reliability, for example, to suppress variation in the threshold voltage of a transistor, the insulating film 202 preferably contains oxygen whose amount is greater than that in the stoichiometric composition ratio, in consideration of oxygen defects that may occur in the oxide semiconductor layer.

The insulating film 212 serves as a gate insulating film of the transistor 110. The insulating film 212 can be formed using, for example, a material such as silicon oxide, silicon nitride, silicon oxynitride, or silicon nitride oxide. Alternatively, the insulating film 212 can be formed using a material including an element of Group 13 and oxygen. For example, as the material including an element of Group 13 and oxygen, a material including one or more of gallium oxide, aluminum oxide, aluminum gallium oxide, and gallium aluminum oxide is given. Here, aluminum gallium oxide refers to a substance that contains aluminum more than gallium in atomic %, and gallium aluminum oxide refers to a substance that contains gallium more than aluminum in atomic %. Further, a material having a high dielectric constant such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added may be employed. Note that the insulating film 212 can be formed to have a single-layer structure or a stacked-layer structure using the above materials.

Many oxide semiconductor materials include an element of Group 13. Therefore, in the case where the insulating film 212 in contact with the oxide semiconductor film is formed using a material including an element of Group 13 and oxygen, the state of the interface with the oxide semiconductor film can be kept favorable. This is because a material including an element of Group 13 and oxygen is well matched with an oxide semiconductor material.

For example, in the case where an oxide semiconductor film including gallium is formed, by using a material including gallium oxide for the insulating film 212, characteristics of an interface between the oxide semiconductor film and the gate insulating film can be kept favorable. Note that, in the case where an element belonging to the same group as a constituent element of the oxide semiconductor is used, a similar effect can be obtained. That is, for the insulating film 212, it is also effective to use a material including aluminum oxide or the like. Aluminum oxide does not easily transmit water; therefore, it is preferable to use the material including aluminum oxide in preventing water from entering the oxide semiconductor film.

Note that two or more kinds of elements of Group 13 may be included in the insulating film 212. For example, the above described material such as aluminum gallium oxide including gallium and aluminum (or gallium aluminum oxide), as described above, may be used for the insulating film 212. In this case, both the effect resulting from including gallium and the effect resulting from including aluminum can be obtained, which is preferable.

Moreover, the insulating film 212 preferably includes a region where an amount of oxygen is greater than that in the stoichiometric composition ratio. Accordingly, oxygen is supplied to the oxide semiconductor film, and oxygen defects in the oxide semiconductor film or at an interface between the oxide semiconductor film and the insulating film 212 can be reduced.

Note that in the case where an oxide semiconductor without oxygen defects is used, the amount of oxygen included in the insulating film 212 may be equal to that in the stoichiometric composition ratio. However, in order to ensure reliability, for example, to suppress variation in the threshold voltage of a transistor, the insulating film 212 preferably contains oxygen whose amount is greater than that in the stoichiometric composition ratio, in consideration of oxygen defects that may occur in the oxide semiconductor layer.

Figure 2A:
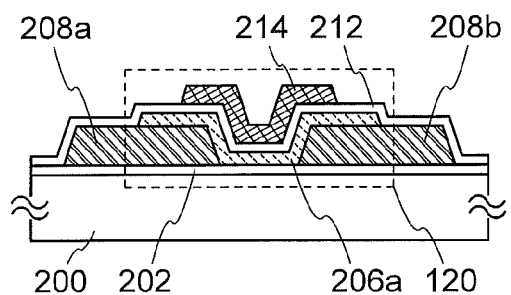
FIGS. 2A to 2D illustrate semiconductor devices.
Figure 2B:
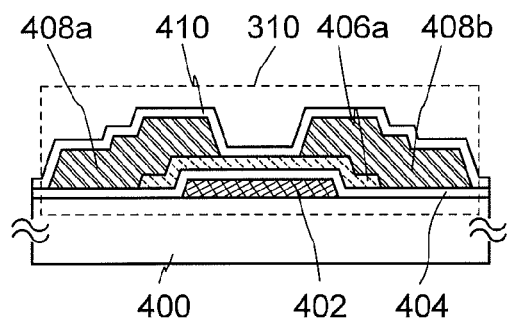
Figure 2C:
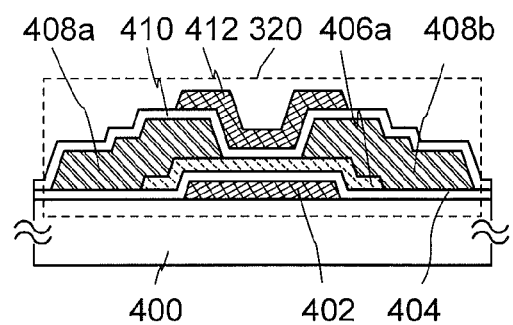
Figure 2D:
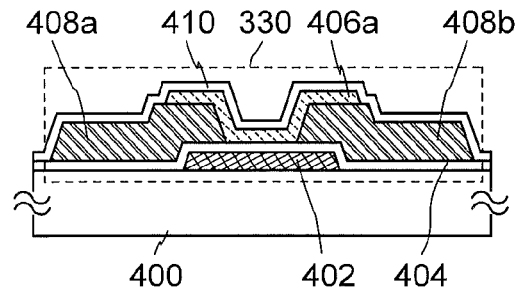

Next, FIGS. 2A to 2D illustrate cross-sectional structures of transistors having different structures from that of the transistor 110. As a transistor according to one embodiment of the present invention, FIG. 2A illustrates a top-gate transistor and FIGS. 2B to 2D illustrate bottom-gate transistors.

A transistor 120 in FIG. 2A is the same as the transistor 110 in that it includes, over the substrate 200, the insulating film 202, the oxide semiconductor film 206a, the source electrode 208a, the drain electrode 208b, the insulating film 212, and the gate electrode 214. A difference between the transistor 120 and the transistor 110 is in a position where the oxide semiconductor film 206a is connected to the source electrode 208a and the drain electrode 208b. That is, the source electrode 208a and the drain electrode 208b are in contact with bottom portions of the oxide semiconductor film 206a in the transistor 120.

A transistor 310 in FIG. 2B is a bottom-gate transistor and includes, over a substrate 400, a gate electrode 402, an insulating film 404, an oxide semiconductor film 406a, a source electrode 408a, a drain electrode 408b, and an insulating film 410. The insulating film 404 serves as a gate insulating film and the insulating film 410 serves as a passivation film. Note that the insulating film 404 corresponds to the insulating film 212 of the transistor 110 in FIGS. 1A to 1C. That is, the insulating film 404 serves as a gate insulating film.

A transistor 320 in FIG. 2C is different from the transistor 310, in that a conductive layer 412 is provided over the insulating film 410 and in a region overlapping with a channel formation region of the oxide semiconductor film 406a. The other components are similar to those in FIG. 2B. Note that the conductive layer 412 serves as a back gate electrode. Therefore, the transistor 320 can also be referred to as a top-gate transistor or a dual-gate transistor. The conductive layer 412 is positioned so that the channel formation region of the oxide semiconductor film 406a is interposed between the conductive layer 412 and the gate electrode 402. By changing a potential of the back gate electrode, the threshold voltage of the transistor can be changed.

A transistor 330 illustrated in FIG. 2D includes, over the substrate 400, the gate electrode 402, the insulating film 404, the oxide semiconductor film 406a, the source electrode 408a, the drain electrode 408b, and the insulating film 410, which is similar to the transistor 310 in FIG. 2B. A difference between the transistor 310 in FIG. 2B and the transistor 330 in FIG. 2D is in the position where the oxide semiconductor film 406a is connected to the source electrode 408a and the drain electrode 408b. That is, in the transistor 330, the source electrode 408a and the drain electrode 408b are in contact with bottom portions of the oxide semiconductor film 406a.

<Example of Manufacturing Process of Transistor>

Hereinafter, examples of manufacturing processes of the transistors will be described with reference to FIGS. 3A to 3E, FIGS. 4A to 4D, and FIGS. 5A to 5D.

<Manufacturing Process of Transistor 110>

An example of a manufacturing process of the transistor 110 in FIGS. 1A to 1C will be described with reference to FIGS. 3A to 3E.

Figure 3A:
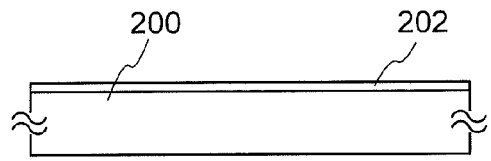
FIGS. 3A to 3E illustrate an example of a manufacturing process of a semiconductor device.

First, the insulating film 202 is formed over the substrate 200 (see FIG. 3A).

There is no particular limitation on the property of a material of the substrate 200 as long as the material has heat resistance high enough to withstand at least heat treatment performed later. For example, a glass substrate, a ceramic substrate, a quartz substrate, or a sapphire substrate can be used as the substrate 200. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 200. Still alternatively, any of these substrates further provided with a semiconductor element may be used as the substrate 200.

A flexible substrate may alternatively be used as the substrate 200. In the case where a transistor is provided over a flexible substrate, for example, the transistor can be directly formed over the flexible substrate.

The insulating film 202 serves as a base film of the transistor 110. For example, the insulating film 202 is formed using a silicon material such as silicon oxide, silicon nitride, silicon oxynitride, or silicon nitride oxide. Alternatively, the insulating film 202 can be formed using a material including an element of Group 13 and oxygen. For example, as the material including an element of Group 13 and oxygen, a material including one or more of gallium oxide, aluminum oxide, aluminum gallium oxide, and gallium aluminum oxide is given. Note that the insulating film 202 can be formed to have a single-layer structure or a stacked-layer structure using the above materials For example, in the case where the insulating film 202 is formed as a single layer, a material including an element of Group 13 and oxygen is preferably used. In the case where the insulating film 202 is formed as a stacked layer, a film using a material including an element of Group 13 and oxygen is preferably formed over a film using a silicon material.

Further, when the above described material including an element of Group 13 (and oxygen) is used for the insulating film 202, plural kinds of an element of Group 13 can be included. In addition to an element of Group 13, an impurity element other than hydrogen, e.g., an element of Group 3 such as yttrium, an element of Group 4 such as hafnium, an element of Group 14 such as silicon, or nitrogen can be included. When the above elements are added to the insulating film in this manner, the energy gap of the insulating film can be controlled by the additive amount of the above elements.

Many oxide semiconductor materials that can be used for forming the oxide semiconductor layer include an element of Group 13. Therefore, in the case where the film using a material including an element of Group 13 and oxygen (the insulating film 202) is formed in contact with the oxide semiconductor film 206a, the state of the interface with the oxide semiconductor film can be kept favorable. This is because a material including an element of Group 13 and oxygen is well matched with an oxide semiconductor material.

The insulating film 202 is preferably formed by using a method in which impurities such as hydrogen and water do not enter the insulating film 202. This is because, when impurities such as hydrogen and water are contained in the insulating film 202, the impurities such as hydrogen and water enter the oxide semiconductor film formed later or oxygen in the oxide semiconductor film is extracted by the impurities such as hydrogen and water, so that a back channel of the oxide semiconductor film has lower resistance (has n-type conductivity) and a parasitic channel might be formed. Therefore, the insulating film 202 is preferably formed so as to contain impurities such as hydrogen and water as little as possible. For example, the insulating film 202 is preferably formed by a sputtering method. It is preferable to use a high-purity gas from which impurities such as hydrogen and water are removed as a sputtering gas when the insulating film 202 is formed.

When the insulating film 202 is formed, a sputtering gas introduced into a deposition chamber of a sputtering apparatus is highly purified by a gas refining apparatus. Specifically, one or more of a nitrogen gas, an oxygen gas, and an argon gas each having a dew point of lower than or equal to −93° C., a content of $H_2O$ of lower than or equal to 52.8 ppb, and a content of hydrogen of lower than or equal to 5 ppb is preferably used. This is because, in the case where a small amount of moisture or hydrogen is included in the sputtering gas, a large amount of moisture or hydrogen might be taken into the insulating film in the process for forming the insulating film. Similarly, when the oxide semiconductor film described later is formed, high purification of the sputtering gas is necessary.

Examples of a sputtering method include a DC sputtering method in which a direct current source is used, a pulsed DC sputtering method in which a direct bias is applied in a pulsed manner, an AC sputtering method, and the like.

Figure 11A:
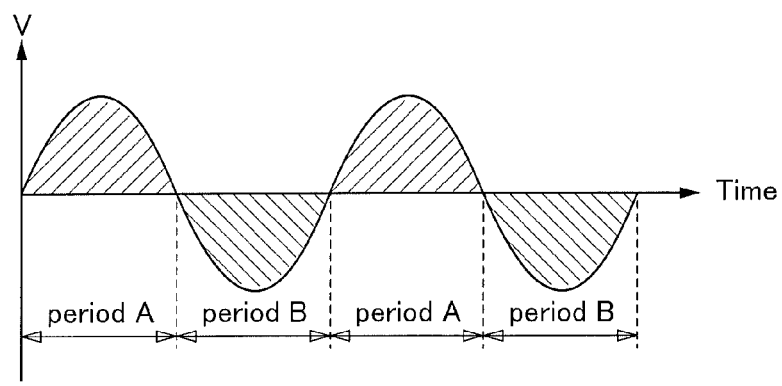
Figure 11A:
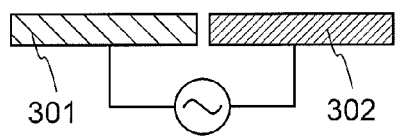
Figure 11A:
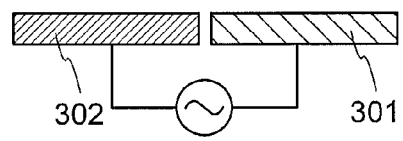

Here, a sputtering method using AC discharge will be described with reference to FIGS. 11A, 11B1, and 11B2. In AC discharge, adjacent targets alternately have a cathode potential and an anode potential. In the period A shown in FIG. 11A, as shown in FIG. 11B1, a target 301 serves as a cathode and a target 302 serves as an anode. On the other hand, in the period B shown in FIG. 11A, as shown in FIG. 11B2, the target 301 serves as an anode and the target 302 serves as a cathode. The total time of the period A and the period B is 20 μsec to 50 μsec and the period A and the period B are repeated at a constant frequency. In this manner, by making the two adjacent targets serve as a cathode and as an anode alternately, stable discharge can be realized. As the result, even when a large size substrate is used, uniform discharge is possible, so that uniform characteristics of the film also in the case of using the large size substrate can be obtained. Thus, since the large size substrate can be used, productivity can be increased.

For example, in the AC sputtering method, aluminum oxide is used as the target 301 and gallium oxide is used as the target 302, whereby a gallium aluminum oxide film or an aluminum gallium oxide film can be formed. Alternatively, when aluminum gallium oxide is used as the target 301 and the target 302, an aluminum gallium oxide film can be formed, similarly.

As the target, a gallium oxide target to which particles of aluminum are added may be used. By using a gallium oxide target to which an aluminum element is added as the target, conductivity of the target can be increased and discharge can be easily performed when the sputtering is performed. With such a target, an oxide insulating film which is suitable for mass production and includes the element belonging to the same group as the oxide semiconductor can be manufactured.

Next, oxygen doping treatment is preferably performed on the insulating film 202. Note that "oxygen doping" means that oxygen is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

When oxygen doping treatment is performed on the insulating film 202, a region where an amount of oxygen is greater than that in the stoichiometric composition ratio is formed in the insulating film 202. By providing such a region, oxygen is supplied to the oxide semiconductor film and oxygen defects in the oxide semiconductor film can be reduced.

Note that in the case where an oxide semiconductor without oxygen defects is used, the amount of oxygen included in the insulating film 202 may be equal to that in the stoichiometric composition ratio. However, in order to ensure reliability, for example, to suppress variation in the threshold voltage of a transistor, the insulating film 202 preferably contains oxygen whose amount is greater than that in the stoichiometric composition ratio, in consideration of oxygen defects that may occur in the oxide semiconductor layer.

In the case where a gallium oxide film is used for the insulating film 202, $Ga_2O_{3+\alpha}$ ($1>\alpha>0$) can be given by the oxygen doping. $\alpha$ can be greater than or equal to 0.04 and less than or equal to 0.09. Alternatively, in the case where an aluminum oxide film is used for the insulating film 202, $Al_2O_{3+\alpha}$ ($1>\alpha>0$) can be given by the oxygen doping. Further alternatively, in the case where an aluminum gallium oxide film is used for the insulating film 202, $Al_xGa_{2-x}O_{3+\alpha}$ ($1<x<2$, $1>\alpha>0$) can be given by the oxygen doping. Further alternatively, in the case where a gallium aluminum oxide film is used for the insulating film 202, $Al_xGa_{2-x}O_{3+\alpha}$ ($0<x\leq1$, $1>\alpha>0$) can be given by the oxygen doping.

Figure 3B:
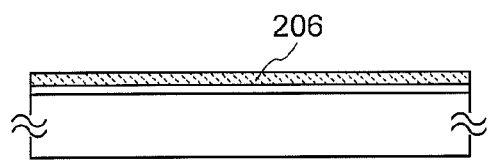

Then, an oxide semiconductor film 206 is formed over the insulating film 202 (see FIG. 3B).

As a material used for the oxide semiconductor film 206, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—

Pr—Zn—O-based material, an In—Nd—Zn—O-based material, an In—Pm—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; or a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material, a Sn—O-based material, or a Zn—O-based material can be used. In addition, the above materials may contain $SiO_2$. Here, for example, an In—Ga—Zn—O-based material means an oxide film including indium (In), gallium (Ga), and zinc (Zn), and there is no particular limitation on the stoichiometric proportion thereof. Further, the In—Ga—Zn—O-based oxide material may contain an element other than In, Ga, and Zn.

The oxide semiconductor film 206 may be a thin film formed using a material expressed by the chemical formula, $InMO_3(ZnO)_m$ (m>0). Here, M represents one or more metal elements selected from Ga, Al, Mn, and Co. For example, M may be Ga, Ga and Al, Ga and Mn, Ga and Co, or the like.

The thickness of the oxide semiconductor film 206 is preferably larger than or equal to 3 nm and smaller than or equal to 30 nm. This is because the transistor might possibly be normally on when the oxide semiconductor film 206 is too thick (e.g., the thickness is 50 nm or more).

The oxide semiconductor film 206 is preferably formed by a method in which an impurity such as hydrogen, water, and a compound having a hydroxyl group does not easily enter the oxide semiconductor film 206. For example, a sputtering method can be used.

When an In—Ga—Zn—O-based material is used as the oxide semiconductor, a target having a composition ratio of $In_2O_3$:$Ga_2O_3$:ZnO=1:1:1 [molar ratio] can be used. Note that it is not necessary to limit the material and the composition ratio of the target to the above. For example, a target having a composition ratio of $In_2O_3$:$Ga_2O_3$:ZnO=1:1:2 [molar ratio] can be used.

In the case where an In—Zn—O-based material is used as the oxide semiconductor, a target to be used has a composition ratio of In:Zn=50:1 to 1:2 in atomic ratio ($In_2O_3$:ZnO=25:1 to 1:4 in molar ratio), preferably In:Zn=20:1 to 1:1 in atomic ratio ($In_2O_3$:ZnO=10:1 to 1:2 in molar ratio), further preferably In:Zn=1.5:1 to 15:1 in atomic ratio ($In_2O_3$:ZnO=3:4 to 15:2 in molar ratio). For example, in a target used for formation of an In—Zn—O-based oxide semiconductor which has an atomic ratio of In:Zn:O=X:Y:Z, the relation of Z>1.5X+Y is satisfied.

The relative density of the target is higher than or equal to 90% and lower than or equal to 100%, preferably, higher than or equal to 95% and lower than or equal to 99.9%. This is because, with the use of the target with a high relative density, the formed oxide semiconductor film 206 can have high density.

The atmosphere for deposition may be a rare gas (typically argon) atmosphere, an oxygen atmosphere, a mixed atmosphere of a rare gas and oxygen, or the like. Further, in order to prevent impurities such as hydrogen and water from entering the oxide semiconductor film 206, it is desirable to use an atmosphere of a high-purity gas from which impurities such as hydrogen and water are sufficiently removed.

In this embodiment, the oxide semiconductor film 206 is formed by a sputtering method with the use of an In—Ga—Zn—O-based target.

First, the substrate 200 is held in a deposition chamber kept under reduced pressure, and the substrate temperature is set to a temperature higher than 200° C. and lower than or equal to 500° C., preferably higher than 300° C. and lower than or equal to 500° C., further preferably higher than or equal to 350° C. and lower than or equal to 450° C.

Then, a high-purity gas from which impurities such as hydrogen and water are sufficiently removed is introduced into the deposition chamber while moisture remaining in the deposition chamber is being removed, and the oxide semiconductor film 206 is formed over the insulating film 202 with the use of the In—Ga—Zn—O-based target. In order to remove moisture remaining in the deposition chamber, an entrapment vacuum pump such as a cryopump, an ion pump, or a titanium sublimation pump is preferably used as an evacuation unit. The evacuation unit may be a turbo pump provided with a cold trap. In the deposition chamber which is evacuated with the cryopump, impurities such as hydrogen and water (further preferably, also a compound containing a carbon atom) are removed, whereby the concentration of impurities such as hydrogen and water in the oxide semiconductor film 206 formed in the deposition chamber can be reduced.

When the substrate temperature during film formation is low (for example, lower than or equal to 100° C.), impurities such as hydrogen and water might possibly enter the oxide semiconductor film 206, so that the heat treatment is preferably performed at the above temperature. The substrate 200 is heated at the above temperature and the oxide semiconductor film 206 is formed. In such a case, the substrate 200 has a high temperature, and a hydrogen bond is cut by the heat. Accordingly, impurities such as hydrogen and water do not be easily taken into the oxide semiconductor film 206. Therefore, by forming the oxide semiconductor film 206 while the substrate 200 is heated at the above temperature, the concentration of impurities such as hydrogen and water in the oxide semiconductor film 206 can be sufficiently reduced. Moreover, damage due to sputtering can be reduced.

Note that, as a method for measuring the amount of water in the oxide semiconductor film 206, thermal desorption spectroscopy (TDS) is given. For example, when the temperature is increased from room temperature to approximately 400° C., elimination of water, hydrogen, and a compound having a hydroxyl group in the oxide semiconductor film can be observed in the range of from 200° C. to 300° C. approximately.

As an example of the film formation conditions, the following conditions can be employed: the distance between the substrate and the target is 60 mm, the pressure is 0.4 Pa, the direct-current (DC) power source is 0.5 kW, the substrate temperature is 400° C., and the film formation atmosphere is an oxygen atmosphere (the proportion of the oxygen flow rate is 100%). Note that a pulsed direct-current power source is preferable because powder substances (also referred to as particles or dust) generated in deposition can be reduced and the film thickness can be uniform.

Note that before the oxide semiconductor film 206 is formed by a sputtering method, powdery substances (also referred to as particles or dust) attached on a surface of the insulating film 202 are preferably removed by reverse sputtering in which an argon gas is introduced and plasma is generated. The reverse sputtering refers to a method in which voltage is applied to a substrate and plasma is generated in the vicinity of the substrate to modify a surface of the substrate side. Note that instead of argon, a gas of nitrogen, helium, oxygen or the like may be used.

Figure 3C:
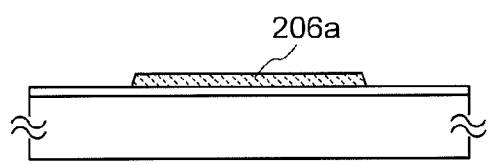

Next, the oxide semiconductor film 206 is processed and the island-shaped oxide semiconductor film 206a is formed (see FIG. 3C).

The oxide semiconductor film 206 can be processed by etching after a mask having a desired shape is formed over the oxide semiconductor film 206. The above mask can be formed by a method such as photolithography. Alternatively, a method such as an inkjet method may be used to form the mask. For the etching of the oxide semiconductor film 206, either wet etching or dry etching may be employed. It is needless to say that these may be combined.

After that, heat treatment (first heat treatment) may be preferably performed on the oxide semiconductor film 206a. The heat treatment eliminates impurities such as hydrogen and water in the oxide semiconductor film 206a; thus, a structure of the oxide semiconductor film 206a can be improved and defect level in energy gap can be reduced.

The heat treatment is performed under an inert gas atmosphere at higher than or equal to 250° C. and lower than or equal to 700° C., preferably higher than or equal to 450° C. and lower than or equal to 600° C., or lower than a strain point of the substrate. As the inert gas atmosphere, an atmosphere that contains nitrogen or a rare gas (e.g., helium, neon, or argon) as its main component and does not contain impurities such as hydrogen and water is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The heat treatment can be performed in such a way that, for example, an object to be heated is introduced into an electric furnace in which a resistance heating element or the like is used and heated, under a nitrogen atmosphere at 450° C. for an hour. During the heat treatment, the oxide semiconductor film 206a is not exposed to the air to prevent the entry of impurities such as hydrogen and water.

The above heat treatment can be referred to as dehydration treatment, dehydrogenation treatment, or the like because of its advantageous effect of removing impurities such as hydrogen and water. The heat treatment can be performed at the timing, for example, after the oxide semiconductor film 206 is formed. Such dehydration treatment or dehydrogenation treatment may be conducted once or plural times.

Next, treatment for supplying oxygen (also referred to as oxygen doping treatment, or the like) is preferably performed on the oxide semiconductor film 206a. As the treatment for supplying oxygen, heat treatment in an oxygen atmosphere (the second heat treatment), treatment with oxygen plasma, or the like is given. Alternatively, the oxygen may be added by performing irradiation with an oxygen ion accelerated by an electric field.

Note that an electrical bias may be applied to the substrate in order to perform oxygen doping more favorably.

By performing oxygen doping treatment on the oxide semiconductor film 206a, the oxygen can be included either in the oxide semiconductor film 206a or in the vicinity of the interface of the oxide semiconductor film 206a; or both in the oxide semiconductor film 206a and in the vicinity of the interface of the oxide semiconductor film 206a. In that case, the amount of oxygen is preferably greater than that in the stoichiometric composition ratio of the oxide semiconductor film 206a.

Note that, after oxygen doping treatment is performed, heat treatment may be performed on the oxide semiconductor film 206a. The heat treatment temperature is higher than or equal to 250° C. and lower than or equal to 700° C., preferably higher than or equal to 400° C. and lower than or equal to 600° C., or lower than the strain point of the substrate.

Through the heat treatment, water, a compound having a hydroxyl group (OH), and the like generated by reaction between oxygen and the oxide semiconductor material can be removed from the oxide semiconductor film. Hydrogen or the like entered the oxide semiconductor film 206a or the like due to the above oxygen doping treatment can also be removed by this heat treatment. The heat treatment may be performed in an atmosphere from which water, hydrogen, or the like is satisfactorily reduced, such as a nitrogen atmosphere, an oxygen atmosphere, an ultra-dry air atmosphere (the moisture amount is 20 ppm (−55° C. by conversion into a dew point) or less, preferably 1 ppm or less, more preferably 10 ppb or less when measured with the use of a dew point meter of a cavity ring down laser spectroscopy (CRDS) system), or a rare gas atmosphere (such as argon and helium). In particular, the heat treatment is preferably performed in an atmosphere containing oxygen. Further, the purity of nitrogen, oxygen, or a rare gas introduced into a heat treatment apparatus is preferably 6N (99.9999%) or higher (that is, the impurity concentration is 1 ppm or lower), further preferably 7N (99.99999%) or higher (that is, the impurity concentration is 0.1 ppm or lower).

Note that the timing of oxygen doping treatment is not limited to the timing described above. However, the oxygen doping treatment is preferably performed after the heat treatment for dehydration or the like.

As described above, the heat treatment for dehydration or the like and oxygen doping treatment or the heat treatment for supply of oxygen are applied, whereby the oxide semiconductor film 206a can be highly purified so as to contain elements (impurity elements) other than main components of the oxide semiconductor film 206a as little as possible. The highly-purified oxide semiconductor film 206a contains extremely few carriers derived from a donor.

Figure 3D:
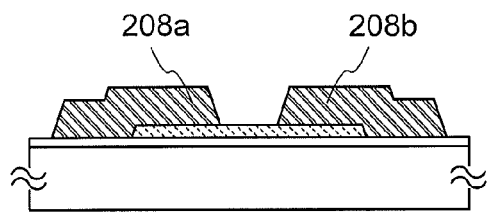

Next, a conductive film for forming the source electrode and the drain electrode (including a wiring formed in the same layer as the source electrode and the drain electrode) is formed over the insulating film 202 and the oxide semiconductor film 206a and processed to form the source electrode 208a and the drain electrode 208b (see FIG. 3D). The channel length L of the transistor depends on the distance between the edges of the source electrode 208a and the drain electrode 208b which are formed here.

As the conductive film serving as the source electrode 208a and the drain electrode 208b, for example, a metal film containing an element selected from aluminum, chromium, copper, tantalum, titanium, molybdenum, or tungsten, or a metal nitride film containing any of the above elements as its component (e.g., a titanium nitride film, a molybdenum nitride film, or a tungsten nitride film) can be used. The source electrode 208a and the drain electrode 208b may be formed to have a single-layer structure or a stacked-layer structure. A metal film having a high melting point of titanium, molybdenum, tungsten, or the like or a metal nitride film of any of these elements (a titanium nitride film, a molybdenum nitride film, or a tungsten nitride film) may be stacked on one of a lower side and an upper side of the metal film of aluminum, copper, or the like or both sides.

Alternatively, the conductive film used for the source electrode 208a and the drain electrode 208b may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO), indium oxide-zinc oxide alloy ($In_2O_3$—ZnO), or any of these metal oxide materials in which silicon oxide is contained can be used.

The conductive film can be processed by being etched after a mask having a desired shape is formed over the conductive film. As the above mask, a resist mask or the like can be used. Ultraviolet, a KrF laser light, an ArF laser light, or the like is preferably used for light exposure for forming a resist mask.

In the case where the channel length L is less than 25 nm, the light exposure at the time of forming the resist mask is preferably performed using, for example, extreme ultraviolet having an extremely short wavelength of several nanometers to several tens of nanometers. In the light exposure by extreme ultraviolet light, the resolution is high and the focus depth is large. Thus, the channel length L of the transistor formed later can be reduced, whereby the operation speed of a circuit can be increased.

An etching step may be performed using a resist mask formed using a multi-tone mask. A resist mask formed using a multi-tone mask has a plurality of thicknesses and can be further changed in shape by ashing; thus, such a resist mask can be used in a plurality of etching steps for different patterns. Therefore, a resist mask corresponding to at least two kinds of different patterns can be formed by using one multi-tone mask. In other words, simplification of the steps can be realized.

In some cases, only part of the oxide semiconductor film 206a is etched to be an oxide semiconductor film 206a having a groove portion (a recessed portion) when the conductive film is etched.

Next, by plasma treatment using a gas such as $N_2O$, $N_2$, or Ar, impurities such as hydrogen and water adsorbed to a surface of an exposed portion of the oxide semiconductor film 206a may be removed.

Then, an insulating film 212 is formed so as to cover the source electrode 208a and the drain electrode 208b and to be in contact with part of the oxide semiconductor film 206a. Next, a conductive film for forming a gate electrode (including a wiring formed in the same layer as the gate electrode) is formed and processed to form the gate electrode 214 (see FIG. 3E).

The insulating film 212 serves as a gate insulating film of the transistor 110. For example, the insulating film 212 is formed using a silicon material such as silicon oxide, silicon nitride, silicon oxynitride, or silicon nitride oxide. Alternatively, the insulating film 212 can be formed using a material including an element of Group 13 and oxygen. For example, as the material including an element of Group 13 and oxygen, a material including one or more of gallium oxide, aluminum oxide, aluminum gallium oxide, and gallium aluminum oxide is given. Further, a material having a high dielectric constant such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added may be employed. Note that the insulating film 212 is formed to have a single-layer structure or a stacked-layer structure using the above materials.

The insulating film 212 is preferably formed by using a method in which impurities such as hydrogen and water do not enter the insulating film 212. This is because, when impurities such as hydrogen and water are contained in the insulating film 212, the impurities such as hydrogen and water enter the oxide semiconductor film formed later or oxygen in the oxide semiconductor film is extracted by the impurities such as hydrogen and water, so that a back channel of the oxide semiconductor film has lower resistance (has n-type conductivity) and a parasitic channel might be formed. Therefore, the insulating film 212 is preferably formed so as to contain impurities such as hydrogen and water as little as possible. For example, the insulating film 212 is preferably formed by a sputtering method. It is preferable to use a high-purity gas from which impurities such as hydrogen and water are removed as a sputtering gas when the insulating film 212 is formed.

Note that the film using a material including an element of Group 13 and oxygen is preferably formed in contact with the oxide semiconductor film 206a. For example, in the case where the insulating film 212 is formed as a single layer, a material including an element of Group 13 and oxygen is preferably used. In the case where the insulating film 212 is formed as a stacked layer, a film using a silicon material or a film using a material having a high dielectric constant is preferably formed over a film using a material including an element of Group 13 and oxygen.

Many oxide semiconductor materials that can be used for forming the oxide semiconductor layer include an element of Group 13. Therefore, in the case where the film using a material including an element of Group 13 and oxygen (the insulating film 212) is formed in contact with the oxide semiconductor film, the state of the interface with the oxide semiconductor film can be kept favorable. This is because a material including an element of Group 13 and oxygen is well matched with an oxide semiconductor material.

Next, oxygen doping treatment is preferably performed on the insulating film 212. Note that "oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

When oxygen doping treatment is performed on the insulating film 212, a region where an amount of oxygen is greater than that in the stoichiometric composition ratio is formed in the insulating film 212. By providing such a region, oxygen is supplied to the oxide semiconductor film and oxygen defects in the oxide semiconductor film can be reduced Note that in the case where an oxide semiconductor without oxygen defects is used, the amount of oxygen included in the insulating film 212 may be equal to that in the stoichiometric composition ratio. However, in order to ensure reliability, for example, to suppress variation in the threshold voltage of a transistor, the insulating film 212 preferably contains oxygen whose amount is greater than that in the stoichiometric composition ratio, in consideration of oxygen defects that may occur in the oxide semiconductor layer.

As the conductive film serving as the gate electrode 214, for example, a metal film containing an element selected from molybdenum, titanium, tantalum, tungsten, aluminum, copper, neodymium, or scandium; an alloy material containing any of these elements as a main component; or the like can be used. Note that the gate electrode 214 may have a single-layer structure or a stacked-layer structure.

The conductive film can be processed by being etched after a mask having a desired shape is formed over the conductive film. As the above mask, a resist mask or the like can be used.

Figure 3E:
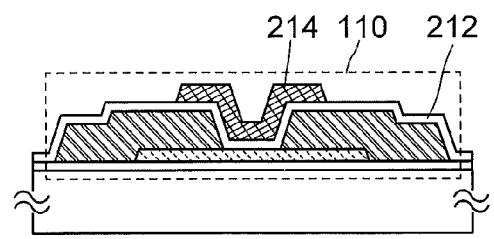

Through the above-described steps, the transistor 110 can be manufactured (see FIG. 3E).

<Manufacturing Process of Transistor 120>

Next, an example of manufacturing steps of the transistor 120 illustrated in FIG. 2A will be described with reference to FIGS. 4A to 4D. The manufacturing process of the transistor 120 is in common with that of the transistor 110 in many points. Therefore, in the following description, repeated description of the same portions is omitted, and different points are described in detail.

First, an insulating film 202 is formed over a substrate 200. The insulating film 202 serves as a base film. The details are similar to those of the insulating film 202 of the transistor 110.

Next, a conductive film for forming a source electrode and a drain electrode (including a wiring formed in the same layer as the source electrode and the drain electrode) is formed over the insulating film 202. The conductive film is processed, so that a source electrode 208a and a drain electrode 208b are formed (see FIG. 4A).

Figure 4A:
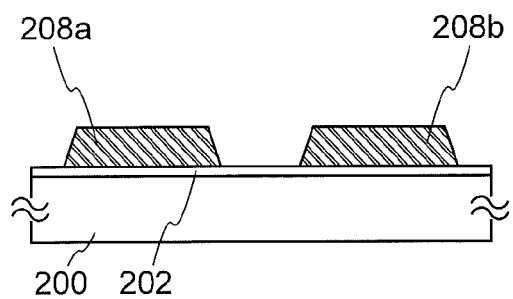
FIGS. 4A to 4D illustrate an example of a manufacturing process of a semiconductor device.
Figure 4B:
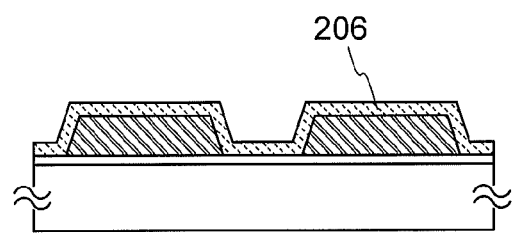
Figure 4C:
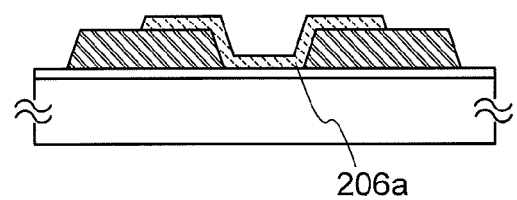

Next, an oxide semiconductor film 206 which is connected to the source electrode 208a and the drain electrode 208b is formed over the insulating film 202 (see FIG. 4B). After that, the oxide semiconductor film 206 is processed and an island-shaped oxide semiconductor film 206a is formed (see FIG. 4C).

After the oxide semiconductor film 206 is formed or the island-shaped oxide semiconductor film 206a is formed, heat treatment (dehydration treatment, dehydrogenation treatment) is preferably performed. Further, oxygen doping treatment is preferably performed on the oxide semiconductor film 206 or the island-shaped oxide semiconductor film 206a. The details of oxygen doping treatment are similar to those of the treatment on the transistor 110.

Next, the insulating film 212 is formed so as to cover the source electrode 208a and the drain electrode 208b and to be in contact with part of the oxide semiconductor film 206a. Then, the gate electrode 214 is formed (see FIG. 4D). The description on the manufacturing process of the transistor 110 can be referred to for the details of the insulating film 212 and the gate electrode 214.

Figure 4D:
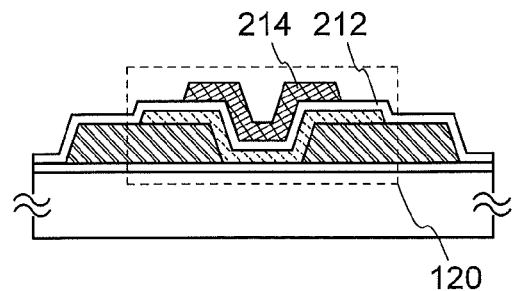

Through the above-described steps, the transistor 120 can be manufactured (see FIG. 4D).

<Manufacturing Processes of Transistor 310 and Transistor 320>

Next, an example of manufacturing processes of the transistor 310 illustrated in FIG. 2B and the transistor 320 illustrated in FIG. 2C will be described with reference to FIGS. 5A to 5D.

First, a conductive film for forming a gate electrode (including a wiring formed in the same layer as the gate electrode) is formed over a substrate 400 and processed to form the gate electrode 402. After that, an insulating film 404 is formed so as to cover the gate electrode 402 (see FIG. 5A). For details of the substrate 400 and the gate electrode 402, the descriptions of the substrate 200 and the gate electrode 214 can be referred to, respectively. For details of the insulating film 404, the description of the insulating film 212 can be referred to. The insulating film 404 serves as a gate insulating film.

Figure 5A:
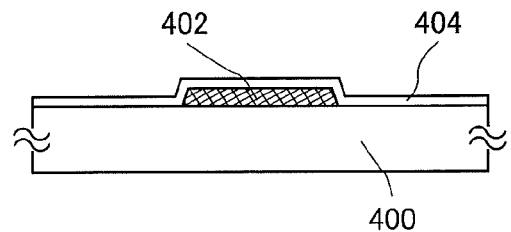
FIGS. 5A to 5D illustrate an example of a manufacturing process of a semiconductor device.
Figure 5B:
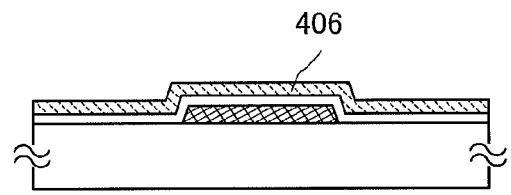

Next, an oxide semiconductor film 406 is formed over the insulating film 404 (see FIG. 5B). For details of the oxide semiconductor film 406, the description of the oxide semiconductor film 206 can be referred to.

Figure 5C:
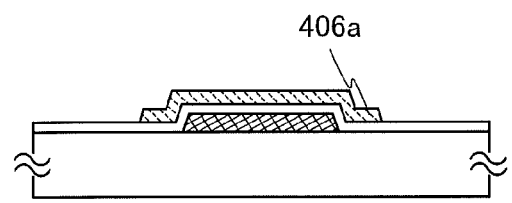

Next, the oxide semiconductor film 406 is processed into an island-shaped oxide semiconductor film 406a (see FIG. 5C). For details of a processing method of the oxide semiconductor film 406, the description of the processing method of the oxide semiconductor film 206 can be referred to.

Next, a conductive film for forming a source electrode and a drain electrode (including a wiring formed in the same layer as the source electrode and the drain electrode) is formed over the insulating film 404 and the oxide semiconductor film 406a and processed to form the source electrode 408a and the drain electrode 408b. After that, an insulating film 410 is formed so as to cover the oxide semiconductor film 406a, the source electrode 408a, and the drain electrode 408b (see FIG. 5D). For details of the source electrode 408a and the drain electrode 408b, the descriptions of the source electrode 208a and the drain electrode 208b can be referred to.

Here, the insulating film 410 serves as a protective film. For details of the material, the manufacturing method, and the like, the description of the insulating film 202 serving as a protective film can be referred to.

Figure 5D:
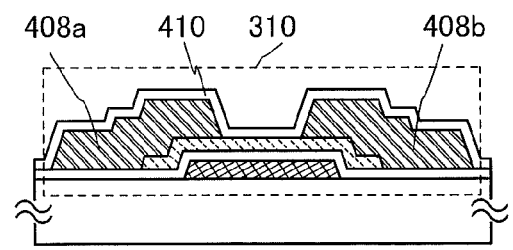

Through the above-described steps, the transistor 310 can be manufactured (see FIG. 5D).

Further, a conductive layer 412 is formed over the insulating film 410 in FIG. 5D. In this manner, the transistor 320 illustrated in FIG. 2C can be formed. The conductive layer 412 serves as a back gate electrode. Accordingly, for details of the conductive layer 412, the description of the gate electrode 402 can be referred to. Further, by changing a potential of the back gate electrode, the threshold voltage of the transistor can be changed.

Note that dehydration treatment, dehydrogenation treatment, oxygen doping treatment, or the like is preferably performed on the oxide semiconductor film in any of the steps after the oxide semiconductor film is formed, in the manufacturing processes of the transistor 310 and the transistor 320.

<Manufacturing Process of Transistor 330>

Next, an example of manufacturing steps of the transistor 330 illustrated in FIG. 2D will be described.

First, a conductive film for forming a gate electrode (including a wiring formed in the same layer as the gate electrode) is formed over a substrate 400 and processed to form the gate electrode 402. After that, an insulating film 404 is formed so as to cover the gate electrode 402. For details of the substrate 400 and the gate electrode 402, the descriptions of the substrate 200 and the gate electrode 214 can be referred to, respectively.

Next, a conductive film for forming the source electrode and the drain electrode (including a wiring formed in the same layer as the source electrode and the drain electrode) is formed over the insulating film 404 and processed to form the source electrode 408a and the drain electrode 408b. For details of the source electrode 408a and the drain electrode 408b, the descriptions of the source electrode 208a and the drain electrode 208b can be referred to.

Next, an oxide semiconductor film is formed over the insulating film 404, the source electrode 408a, and the drain electrode 408b and the oxide semiconductor film is processed, so that an island-shaped oxide semiconductor film 406a is formed. For details of the oxide semiconductor film 406a, the description of the oxide semiconductor film 206a can be referred to.

Next, an insulating film 410 is formed so as to cover the oxide semiconductor film 406a, the source electrode 408a, and the drain electrode 408b. For details of the insulating film 404 and the insulating film 410, the description of the insulating film 202 can be referred to. For example, the insulating film 404 can be formed using a gallium oxide film and the insulating film 410 can be formed using a silicon oxide film.

Through the above-described steps, the transistor 330 can be manufactured (see FIG. 5D).

Note that dehydration treatment or dehydrogenation treatment is preferably performed on the oxide semiconductor film in any of the steps after the oxide semiconductor film is formed, in the manufacturing process of the transistor 330.

As described in this embodiment, the oxide semiconductor film is provided in contact with the film using a material including an element of Group 13 and oxygen, whereby the state of the interface with the oxide semiconductor film can be kept favorable.

Moreover, the insulating film which is contact with the oxide semiconductor film includes a region where an amount of oxygen is greater than that in the stoichiometric composition ratio. Accordingly, oxygen is supplied to the oxide semiconductor film, and oxygen defects in the oxide semiconductor film can be reduced.

Thus, a semiconductor device including an oxide semiconductor with stable electric characteristics can be provided. Therefore, a semiconductor device with high reliability can be provided.

The structures and methods described in this embodiment can be combined as appropriate with any of the structures and methods described in the other embodiments.

Embodiment 2

A semiconductor device (also referred to as a display device) with a display function can be manufactured using the transistor, an example of which is described in Embodiment 1. Moreover, some or all of the driver circuits which include the transistor can be formed over a substrate where the pixel portion is formed, whereby a system-on-panel can be obtained.

Figure 6A:
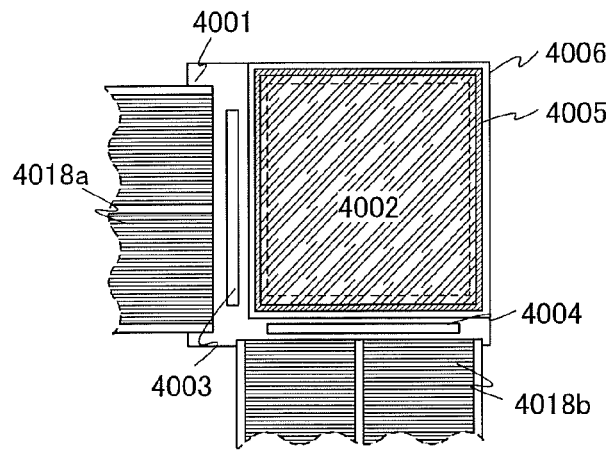
FIGS. 6A to 6C each illustrate one embodiment of a semiconductor device.

In FIG. 6A, a sealant 4005 is provided to surround a pixel portion 4002 provided over a first substrate 4001, and the pixel portion 4002 is sealed with the sealant 4005 and the second substrate 4006. In FIG. 6A, a scan line driver circuit 4004 and a signal line driver circuit 4003 each are formed using a single crystal semiconductor film or a polycrystalline semiconductor film over a substrate prepared separately, and mounted in a region different from the region surrounded by the sealant 4005 over the first substrate 4001. Various signals and potentials are supplied to the signal line driver circuit 4003 and the scan line driver circuit 4004 each of which is separately formed, and the pixel portion 4002, from flexible printed circuits (FPCs) 4018a and 4018b.

Figure 6B:
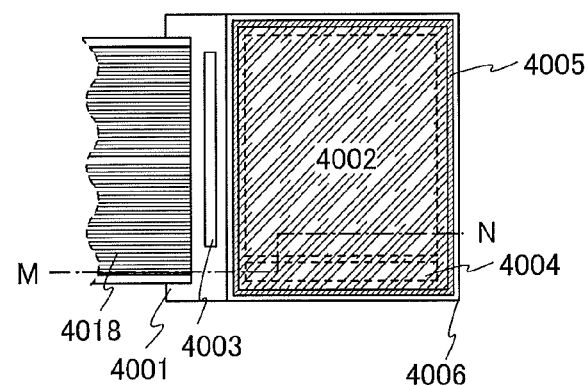
Figure 6C:
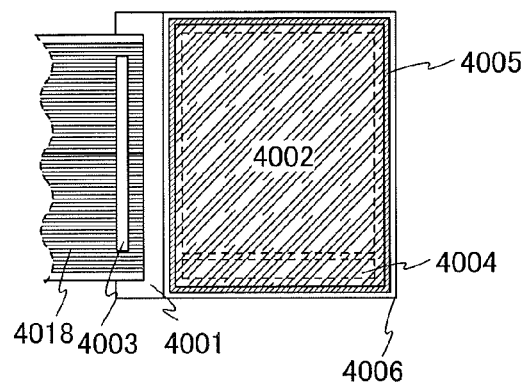

In FIGS. 6B and 6C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 6B and 6C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 6B and 6C, various signals and potentials are supplied to the separately formed signal line driver circuit 4003, the scan line driver circuit 4004, and the pixel portion 4002, from an FPC 4018.

Although FIGS. 6B and 6C each show the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 6A shows an example in which the signal line driver circuit 4003 and the scan line driver circuit 4004 are mounted by a COG method. FIG. 6B shows an example in which the signal line driver circuit 4003 is mounted by a COG method. FIG. 6C shows an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit which are provided over the first substrate include a plurality of transistors, to which any of the transistors described in Embodiment 1 can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 7:
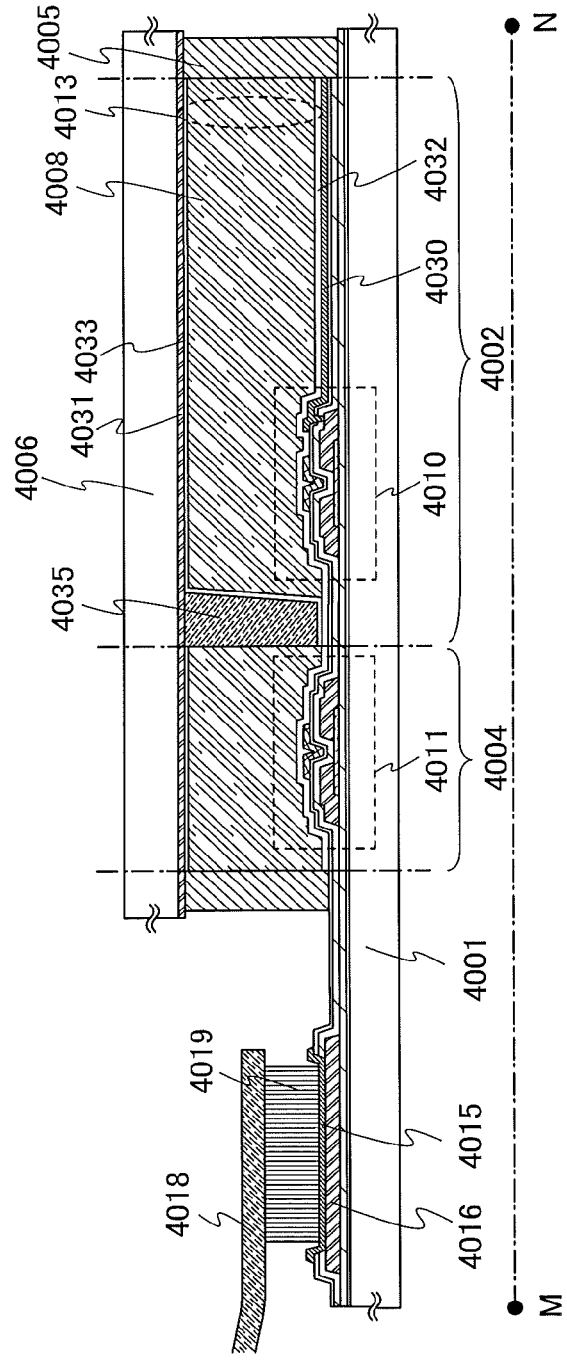
FIG. 7 illustrates one embodiment of a semiconductor device.
Figure 8:
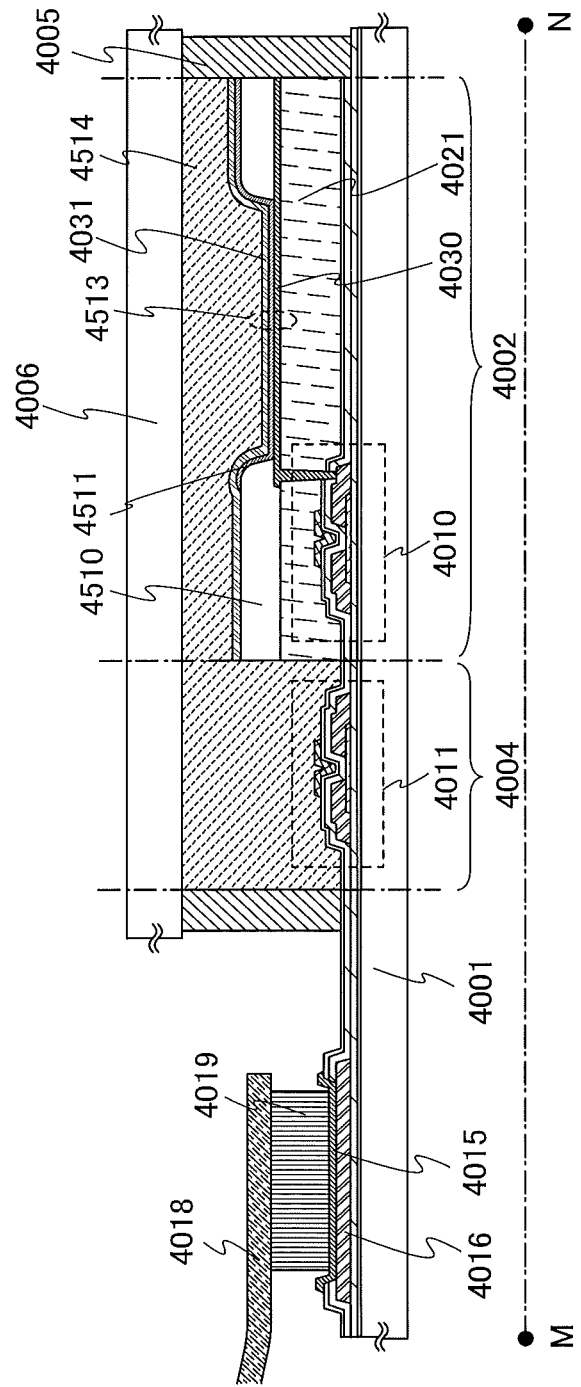
FIG. 8 illustrates one embodiment of a semiconductor device.
Figure 9:
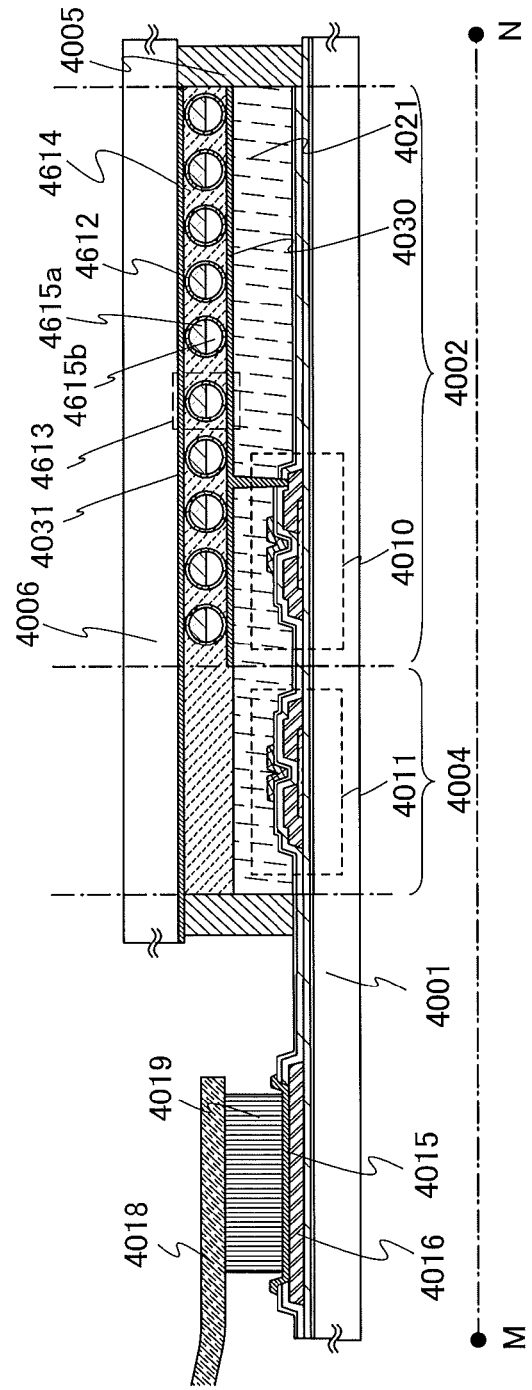
FIG. 9 illustrates one embodiment of a semiconductor device.

One embodiment of the semiconductor device is described with reference to FIG. 7 to FIG. 9. FIG. 7 to FIG. 9 correspond to cross-sectional views taken along line M-N in FIG. 6B.

As shown in FIG. 7 to FIG. 9, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed of the same conductive film as a first electrode layer 4030. The terminal electrode 4016 is formed of the same conductive film as a source electrode and a drain electrode of transistors 4010 and 4011.

Each of the pixel portion 4002 and the scan line driver circuit 4004 provided over the first substrate 4001 includes a plurality of transistors. In FIG. 7 to FIG. 9, the transistor 4010 included in the pixel portion 4002 and the transistor 4011 included in the scan line driver circuit 4004 are shown as an example.

In this embodiment, any of the transistors shown in Embodiment 1 can be applied to the transistors 4010 and 4011. Variation in electrical characteristics of the transistor 4010 and the transistor 4011 is suppressed and the transistor 4010 and the transistor 4011 are electrically stable. As described above, a semiconductor device with high reliability as the semiconductor devices in this embodiment in FIG. 7 to FIG. 9 can be obtained.

The transistor 4010 included in the pixel portion 4002 is electrically connected to a display element to form a display panel. A variety of display elements can be used as the display element as long as display can be performed.

An example of a liquid crystal display device using a liquid crystal element as a display element is shown in FIG. 7. In FIG. 7, a liquid crystal element 4013 is a display element including the first electrode layer 4030, a second electrode layer 4031, and a liquid crystal layer 4008. Insulating films 4032 and 4033 serving as orientation films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating film and is provided in order to control the thickness (a cell gap) of the liquid crystal layer 4008. Alternatively, a spherical spacer may also be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1\times10^9$ Ω·cm or more, preferably $1\times10^{11}$ Ω·cm or more, more preferably $1\times10^{12}$ Ω·cm or more. The value of the specific resistivity in this specification is measured at 20° C.

The size of storage capacitor formed in the liquid crystal display device is set considering the leakage current of the transistor provided in the pixel portion or the like so that charge can be held for a predetermined period. By using the transistor including the highly-purified oxide semiconductor film, it is enough to provide a storage capacitor having a capacitance that is ⅓ or less, preferably ⅕ or less of a liquid crystal capacitance of each pixel.

In the transistor described in Embodiment 1, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

Further, the transistors described in Embodiment 1 can exhibit relatively high field-effect mobility and thus can operate at high speed. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an ASV mode, and the like can be given. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. However, one embodiment of the present invention is not limited to a color display device and can be applied to a monochrome display device.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. Then a transistor and a light-emitting element are formed over a substrate. The light-emitting element can have any of the following structure: a top emission structure in which light is extracted through the surface opposite to the substrate; a bottom emission structure in which light is extracted through the surface on the substrate side; or a dual emission structure in which light is extracted through the surface opposite to the substrate and the surface on the substrate side.

FIG. 8 illustrates an example of a light-emitting device in which a light-emitting element is used as a display element. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated in FIG. 8. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In a space sealed with the first substrate 4001, the second substrate 4006, and the sealant 4005, a filler 4514 is provided and tightly sealed. It is preferable that the light-emitting device be packaged (sealed) with a protective film (such as a laminate film or an ultraviolet curable resin film) or a cover material with high air-tightness and little degasification so that the light-emitting device is not exposed to the outside air, in this manner.

As the filler 4514, an ultraviolet curable resin or a thermosetting resin can be used as well as an inert gas such as nitrogen or argon; polyvinyl chloride (PVC), acrylic, polyimide, epoxy resin, silicone resin, polyvinyl butyral (PVB), or ethylene vinyl acetate (EVA) can be used. For example, nitrogen may be used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

FIG. 9 illustrates an active matrix electronic paper as an embodiment of a semiconductor device. The electronic paper in FIG. 9 is an example of a display device using a twisting ball display system.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 7 to FIG. 9, a flexible substrate as well as a glass substrate can be used as the first substrate 4001 and the second substrate 4006, e.g., a plastic substrate having a light-transmitting property or the like. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 4021 can be formed using an inorganic insulating material or an organic insulating material. Note that the insulating layer 4021 formed using a heat-resistant organic insulating material such as an acrylic resin, polyimide, a benzocyclobutene resin, polyamide, or an epoxy resin is preferably used as a planarizing insulating film. Other than such organic insulating materials, it is possible to use a low-dielectric constant material (a low-k material), a siloxane based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, the insulating layer 4021 can be formed, depending on the material, by a sputtering method, a spin coating method, a dipping method, spray coating, a droplet discharge method (an inkjet method), screen printing, offset printing, roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Since the transistor is easily broken owing to static electricity or the like, a protective circuit for protecting the driver circuit is preferably provided. The protection circuit is preferably formed using a nonlinear element.

As described above, by using any of the transistors shown in Embodiment 1, a semiconductor device having a high reliability can be provided. Note that the transistors described in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

The methods and structures described in this embodiment can be combined as appropriate with any of the methods and structures described in the other embodiments.

Embodiment 3

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic appliances each including the liquid crystal display device described in the above embodiment are described.

Figure 10A:
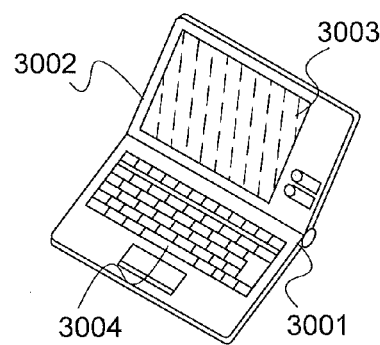
FIGS. 10A to 10F each illustrate an electronic appliance.

FIG. 10A illustrates a laptop personal computer, which includes a main body 3001, a housing 3002, a display portion 3003, a keyboard 3004, and the like. By applying the semiconductor device described in Embodiment 1 or 2, the laptop personal computer can have high reliability.

Figure 10B:
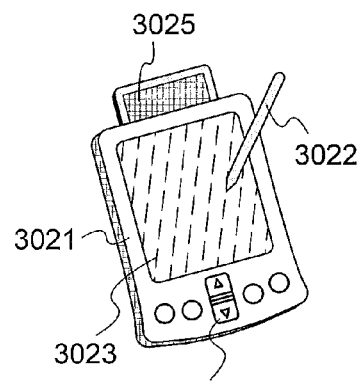

FIG. 10B is a portable information terminal (PDA) which includes a display portion 3023, an external interface 3025, an operation button 3024, and the like in a main body 3021. A stylus 3022 is included as an accessory for operation. By applying the semiconductor device described in Embodiment 1 or 2, the portable information terminal (PDA) can have higher reliability.

Figure 10C:
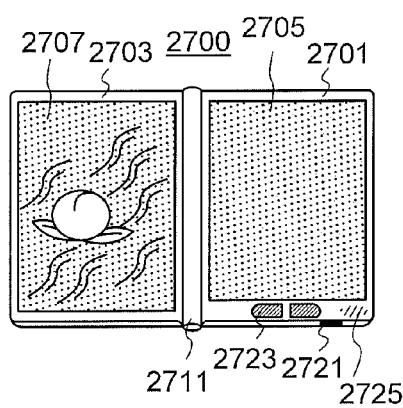

FIG. 10C illustrates an example of an e-book reader. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 10C) and graphics can be displayed on a display portion on the left side (the display portion 2707 in FIG. 10C). By applying the semiconductor device described in Embodiment 1 or 2, the e-book reader 2700 can have high reliability.

FIG. 10C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, and the like may be provided on the same plane as the display portion of the housing. Furthermore, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an e-book reader server.

Figure 10D:
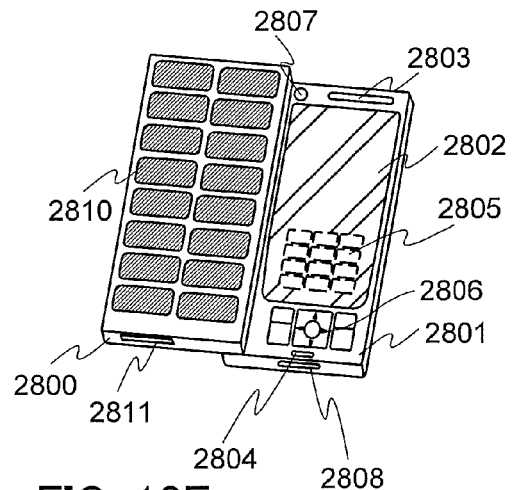

FIG. 10D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. Further, an antenna is incorporated in the housing 2801. By applying the semiconductor device described in Embodiment 1 or 2, the mobile phone can have high reliability.

Further, the display panel 2802 is provided with a touch panel. A plurality of operation keys 2805 which are displayed as images is illustrated by dashed lines in FIG. 10D. Note that a boosting circuit by which a voltage output from the solar cell 2810 is increased to be sufficiently high for each circuit is also included.

The display direction of the display panel 2802 is changed as appropriate depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are opened as illustrated in FIG. 10D can be slid so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a larger amount of data can be saved and moved by inserting a recording medium to the external memory slot 2811.

Further, in addition to the above functions, an infrared communication function, a television reception function, or the like may be provided.

Figure 10E:
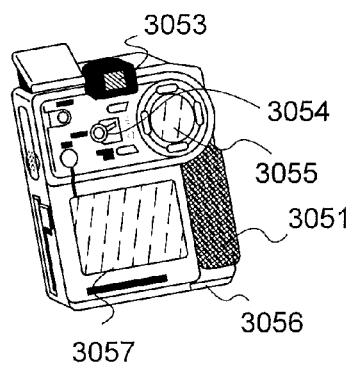

FIG. 10E illustrates a digital video camera which includes a main body 3051, a display portion A 3057, an eyepiece 3053, an operation switch 3054, a display portion B 3055, a battery 3056, and the like. By applying the semiconductor device described in Embodiment 1 or 2, the digital video camera can have high reliability.

Figure 10F:
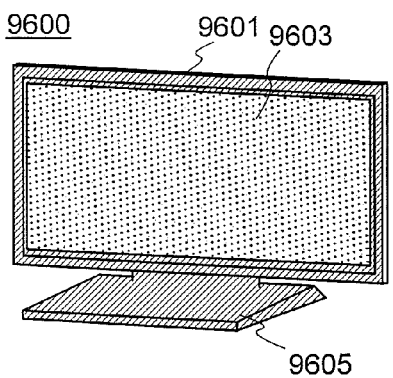

FIG. 10F illustrates an example of a television set. In the television set 9600, a display portion 9603 is incorporated in a housing 9601. The display portion 9603 can display images. Here, the housing 9601 is supported by a stand 9605. By applying the semiconductor device described in Embodiment 1 or 2, the television set 9600 can have high reliability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

The structures and methods described in this embodiment can be combined as appropriate with any of the structures and methods described in the other embodiments.

Example 1

Figure 12:
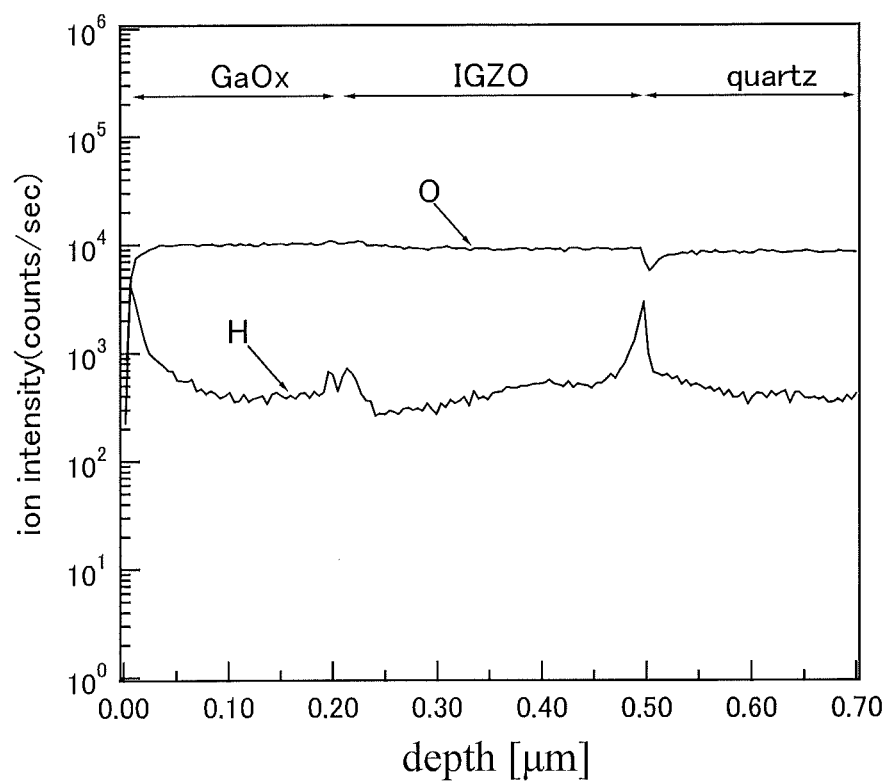
FIG. 12 shows the ion intensity of hydrogen and oxygen by SIMS measurement.

In this example, in a semiconductor device according to one embodiment of the present invention, the evaluation results of a pileup of hydrogen at an interface between an oxide semiconductor film and an insulating film are described with reference to FIG. 12 and FIG. 13. As the evaluation method, secondary ion mass spectroscopy (SIMS) was used.

First, samples used in this example are described. In this example, Sample A in which an oxide semiconductor film and a gallium oxide film were formed over a quartz substrate and Sample B in which an oxide semiconductor film and a silicon oxide film were formed over a quartz substrate were used.

In Sample A and Sample B, as the oxide semiconductor film, an In—Ga—Zn—O-based oxide semiconductor film was used. The In—Ga—Zn—O-based oxide semiconductor film with a thickness of 300 nm was deposited by a sputtering method under the following conditions: a target having an atomic ratio of In:Ga:Zn=1:1:0.5 was used, the distance between the quartz substrate and the target was 60 mm, the pressure was 0.4 Pa, the power was 0.5 kW, the atmosphere was a mixed atmosphere of argon and oxygen (Ar:O$_2$=10 sccm:5 sccm), and the substrate temperature was room temperature.

Further, in Sample A, the gallium oxide film with a thickness of 200 nm was deposited over the oxide semiconductor film by a sputtering method under the following conditions: a gallium oxide target was used, the distance between the quartz substrate and the target was 60 mm, the pressure was 0.4 Pa, the power was 1.0 kW, the atmosphere was a mixed atmosphere of argon and oxygen (Ar:O$_2$=25 sccm:25 sccm), and the substrate temperature was room temperature.

Furthermore, in Sample B, the silicon oxide film with a thickness of 200 nm was deposited over the oxide semiconductor film by a sputtering method under the following conditions: a silicon oxide target was used, the distance between the quartz substrate and the target was 60 mm, the pressure was 0.4 Pa, the power was 1.5 kW, the atmosphere was a mixed atmosphere of argon and oxygen (Ar:O$_2$=25 sccm: 25 sccm), and the substrate temperature was 250° C.

Next, heat treatment was performed on Sample A and Sample B. The heat treatment was performed in a nitrogen atmosphere at a temperature of 450° C. for one hour using a muffle furnace as an electric furnace for performing heat treatment.

Next, in Sample A and Sample B, the ion intensity of hydrogen and oxygen was measured by SIMS. FIG. 12 shows the ion intensity of hydrogen and oxygen in Sample A by SIMS. FIG. 13 shows the ion intensity of hydrogen and oxygen in Sample B by SIMS. The vertical axis represents the ion intensity (counts/sec) and the horizontal axis represents the depth from a surface (μm).

Figure 13:
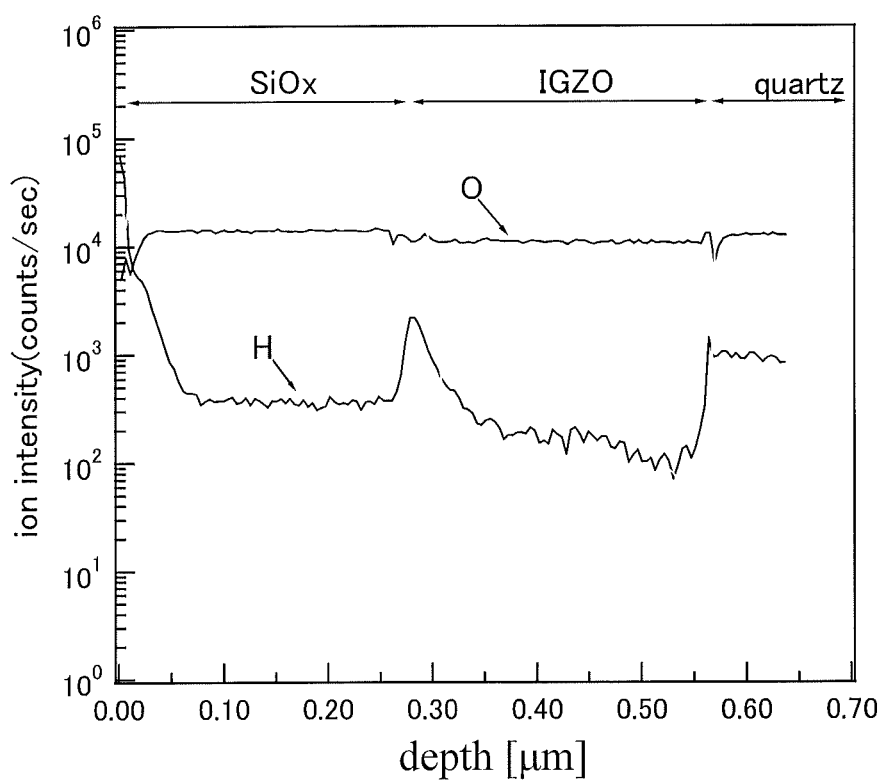
FIG. 13 shows the ion intensity of hydrogen and oxygen by SIMS measurement.

In Sample B shown in FIG. 13, a high ion intensity derived from hydrogen was observed at an interface between the oxide semiconductor film and the silicon oxide film. In contrast, in Sample A shown in FIG. 12, the ion intensity derived from hydrogen was largely decreased at an interface between the oxide semiconductor film and the gallium oxide film. That is, it was found that a pileup of hydrogen at an interface between the gallium oxide film and the oxide semiconductor film can be reduced, as compared with a pileup of hydrogen at an interface between the silicon oxide film and the oxide semiconductor film.

Since silicon oxide has a covalent bond property, it is considered that bonding of the In—Ga—Zn—O-based oxide semiconductor film having an ion bonding property and the silicon oxide film was decreased at the interface, whereby dangling bonds of oxygen atoms were increased. Accordingly, it is considered that a pileup of hydrogen atoms was increased. In contrast, since gallium oxide has an ionic bonding property, bonding of the gallium oxide film and the In—Ga—Zn—O-based oxide semiconductor film also having an ionic bonding property at the interface is favorable. As a result, it is considered that dangling bonds of oxygen atoms were decreased at an interface between the gallium oxide film and the In—Ga—Zn—O-based oxide semiconductor film, whereby a pileup of hydrogen atoms was decreased.

The above-described results reveal that, by providing the oxide semiconductor film in contact with the gallium oxide, a pileup of hydrogen atoms at the interface between the oxide semiconductor film and the gallium oxide can be reduced.

EXPLANATION OF REFERENCE

110: transistor, 120: transistor, 200: substrate, 202: insulating film, 206: oxide semiconductor film, 206a: oxide semiconductor film, 208a: source electrode, 208b: drain electrode, 212: insulating film, 214: gate electrode, 310: transistor, 320: transistor, 330: transistor, 400: substrate, 402: gate electrode, 404: insulating film, 406: oxide semiconductor film, 406a: oxide semiconductor film, 408a: source electrode, 408b: drain electrode, 410: insulating film, 412: conductive layer, 2700: e-book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eyepiece, 3054: operation switch, 3055: display portion B, 3056: battery, 3057: display portion A, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4018a: FPC, 4018b: FPC, 4019: anisotropic conductive film, 4021: insulating layer, 4030: electrode layer, 4031: electrode layer, 4032: insulating film, 4510: partition wall, 4511: electroluminescent layer, 4513: light-emitting element, 4514: filler, 4612: cavity, 4613: spherical particle, 4614: filler, 4615a: black region, 4615b: white region, 9600: television set, 9601: housing, 9603: display portion, and 9605: stand.

This application is based on Japanese Patent Application serial no. 2010-134428 filed with Japan Patent Office on Jun. 11, 2010, and Japanese Patent Application serial no. 2011-088119 filed with Japan Patent Office on Apr. 12, 2011, the entire contents of which are hereby incorporated by reference.

The invention claimed is:

1. A semiconductor device comprising:
a gate electrode;
a first insulating film including gallium and oxygen over the gate electrode;
an oxide semiconductor film over the first insulating film; and
a second insulating film including gallium and oxygen over the oxide semiconductor film,
wherein the first insulating film is in contact with a first face of the oxide semiconductor film,
wherein the second insulating film is in contact with a second face of the oxide semiconductor film,
wherein the first insulating film is a gallium oxide film, and
wherein the second insulating film is a gallium oxide film.

2. The semiconductor device according to claim 1, wherein the first insulating film comprises a region where an amount of oxygen is greater than an amount of oxygen in a stoichiometric composition ratio.

3. The semiconductor device according to claim 1, wherein the oxide semiconductor film includes at least one of In, Ga, and Zn.

4. The semiconductor device according to claim 1, further comprising:
a source electrode and a drain electrode over the oxide semiconductor film,
wherein the second insulating film is formed over the source electrode and the drain electrode, wherein the source electrode and the drain electrode are electrically connected to the oxide semiconductor film.

5. The semiconductor device according to claim 1, further comprising:
a source electrode and a drain electrode over the first insulating film,
wherein the oxide semiconductor film is formed over the source electrode and the drain electrode,
wherein the source electrode and the drain electrode are electrically connected to the oxide semiconductor film.

6. A semiconductor device comprising:
a gate electrode;
a first insulating film including gallium and oxygen over the gate electrode;
an oxide semiconductor film over the first insulating film; and
a second insulating film including gallium and oxygen over the oxide semiconductor film,
wherein the first insulating film is in contact with a first face of the oxide semiconductor film,
wherein the second insulating film is in contact with a second face of the oxide semiconductor film,
wherein the first insulating film is a gallium aluminum oxide film or an aluminum gallium oxide film, and
wherein the second insulating film is a gallium aluminum oxide film or an aluminum gallium oxide film.

7. The semiconductor device according to claim 6, wherein the second insulating film comprises a region where an amount of oxygen is greater than an amount of oxygen in a stoichiometric composition ratio.

8. The semiconductor device according to claim 6, wherein the oxide semiconductor film includes at least one of In, Ga, and Zn.

9. The semiconductor device according to claim 6, further comprising:
a source electrode and a drain electrode over the oxide semiconductor film,
wherein the second insulating film is formed over the source electrode and the drain electrode,
wherein the source electrode and the drain electrode are electrically connected to the oxide semiconductor film.

10. The semiconductor device according to claim 6, further comprising:
a source electrode and a drain electrode over the first insulating film,
wherein the oxide semiconductor film is formed over the source electrode and the drain electrode,
wherein the source electrode and the drain electrode are electrically connected to the oxide semiconductor film.

11. A semiconductor device comprising:
a gate electrode;
a first insulating film including gallium and oxygen over the gate electrode;
an oxide semiconductor film over the first insulating film; and
a second insulating film including gallium and oxygen over the oxide semiconductor film,
wherein the first insulating film is in contact with a first face of the oxide semiconductor film, and
wherein the second insulating film is in contact with a second face of the oxide semiconductor film.

12. The semiconductor device according to claim 11, wherein at least one of the first insulating film and the second insulating film comprises a region where an amount of oxygen is greater than an amount of oxygen in a stoichiometric composition ratio.

13. The semiconductor device according to claim 11, wherein the oxide semiconductor film includes at least one of In, Ga, and Zn.

14. The semiconductor device according to claim 11, further comprising:
a source electrode and a drain electrode over the oxide semiconductor film,
wherein the second insulating film is formed over the source electrode and the drain electrode,
wherein the source electrode and the drain electrode are electrically connected to the oxide semiconductor film.

15. The semiconductor device according to claim 11, further comprising:
a source electrode and a drain electrode over the first insulating film,
wherein the oxide semiconductor film is formed over the source electrode and the drain electrode,
wherein the source electrode and the drain electrode are electrically connected to the oxide semiconductor film.

16. The semiconductor device according to claim 11, wherein the oxide semiconductor film is surrounded by the first insulating film and the second insulating film.

* * * * *